US010677862B2

(12) United States Patent
Hausotte et al.

(10) Patent No.: US 10,677,862 B2
(45) Date of Patent: Jun. 9, 2020

(54) SIGNAL RECEIVER FOR A MAGNETIC RESONANCE APPARATUS (71) Applicant: Siemens Healthcare GmbH, Erlangen (DE)

(72) Inventors: Annemarie Hausotte, Erlangen (DE); Hubertus Fischer, Bamberg (DE)

(73) Assignee: Siemens Healthcare GmbH, Erlangen (DE)

( * ) Notice: Subject to any disclaimer, the term of this patent is extended or adjusted under 35 U.S.C. 154(b) by 199 days.

(21) Appl. No.: 15/887,322

(22) Filed: Feb. 2, 2018

(65) Prior Publication Data

US 2018/0217213 A1 Aug. 2, 2018

(30) Foreign Application Priority Data

Feb. 2, 2017 (DE) .................. 10 2017 201 675

(51) Int. Cl.
*G01R 33/60* (2006.01)
*G01R 33/3415* (2006.01)
*G01R 33/36* (2006.01)
*G01R 33/54* (2006.01)
*G01R 33/28* (2006.01)
*G01R 33/30* (2006.01)

(52) U.S. Cl.
CPC ....... *G01R 33/3415* (2013.01); *G01R 33/283* (2013.01); *G01R 33/307* (2013.01); *G01R 33/3664* (2013.01); *G01R 33/543* (2013.01)

(58) Field of Classification Search
CPC .............. G01R 33/543; G01R 33/5608; G01R 33/4828; G01R 33/3415; G01R 33/283; G01R 33/307; G01R 33/60; G01V 3/32; E21B 49/08; E21B 2049/085; G01N 24/10

USPC .................. 324/307, 309, 318, 322, 314
See application file for complete search history.

(56) References Cited

U.S. PATENT DOCUMENTS

| | | | |
|---|---|---|---|
| 5,084,677 A * | 1/1992 | McDougall | G01R 33/3875 324/320 |
| 6,456,072 B1 * | 9/2002 | Webb | G01R 33/30 324/307 |
| 7,701,213 B2 * | 4/2010 | Graesslin | G01R 33/3415 324/309 |
| 2005/0275402 A1 | 12/2005 | Campagna | |
| 2007/0210793 A1 | 9/2007 | Kiefer | |
| 2008/0211502 A1 | 9/2008 | Arnold et al. | |
| 2008/0258728 A1 * | 10/2008 | Vernickel | G01R 33/365 324/318 |
| 2010/0164492 A1 * | 7/2010 | Leussler | G01R 33/3415 324/307 |
| 2011/0178384 A1 | 7/2011 | Kuth et al. | |
| 2013/0221962 A1 * | 8/2013 | Fautz | G01R 33/5612 324/309 |

(Continued)

FOREIGN PATENT DOCUMENTS

DE 102011080755 A1 2/2013

*Primary Examiner* — Patrick Assouad
*Assistant Examiner* — Taqi R Nasir
(74) *Attorney, Agent, or Firm* — Schiff Hardin LLP (57) ABSTRACT A signal receiver for receiving signals produced by a magnetic resonance scanner from an examination subject has an operating circuit and a local coil assembly having at least two coils, wherein the operating circuit is used to individually activate at least one of the at least two coils, and the operating circuit is located inside an RF-shielded room surrounding the magnetic resonance scanner.

14 Claims, 3 Drawing Sheets (56) References Cited

U.S. PATENT DOCUMENTS

2014/0254646 A1* 9/2014 Harwell .............. H04B 5/0031
375/222
2015/0169001 A1 6/2015 Sedlmair

* cited by examiner

SIGNAL RECEIVER FOR A MAGNETIC RESONANCE APPARATUS

BACKGROUND OF THE INVENTION

Field of the Invention

The invention concerns a signal receiver for receiving magnetic resonance signals produced in a data acquisition scanner of a magnetic resonance (MR) apparatus. The present invention also concerns a method for preparing for an examination of an examination subject by an MR apparatus.

Description of the Prior Art

In an MR apparatus, a basic field magnet is used to apply a relatively strong basic magnetic field, for example of 1.5 or 3 tesla, to the body of a subject to be examined, such as a patient. In addition, a gradient coil arrangement is used to emit gradient pulses. Radio frequency pulses (RF pulses), for instance excitation pulses, are then radiated by an RF antenna unit using suitable antenna coils, causing the nuclear spins of certain atoms, which have been excited to resonance by these RF pulses, to be tipped by a defined flip angle with respect to the magnetic field lines of the basic magnetic field. RF signals, known as magnetic resonance signals, are emitted as the nuclear spins relax, and these signals are received by a signal receiver having coils designed as RF antennas, and are then processed further. Raw data are thereby acquired that ultimately can be reconstructed into the desired image data.

In magnetic resonance imaging, magnetic resonance signals are typically received from a segment of the examination subject, i.e. from a sub-volume of the examination subject, and reconstructed into image data. The sub-volume to be depicted or the region to be imaged of the subject is the examination region. This region is typically selected individually for the subject examination on the basis of medical questions to be answered, and can accordingly have various sizes and different positions. A signal receiver having at least one local coil is typically used to receive the magnetic resonance signals. Such a local coil usually is composed of multiple individual coils. The type of the local coil can be chosen according to the region under examination. At the start of a magnetic resonance examination, i.e. an examination using a magnetic resonance apparatus, a local coil is usually positioned on the examination region and activated.

SUMMARY OF THE INVENTION

An object of the invention is to provide a signal receiver for receiving magnetic resonance signals produced by a magnetic resonance scanner, the signal receiver being operable efficiently, and to provide a simple method for preparing for a magnetic resonance examination of a subject.

The signal receiver according to the invention for receiving magnetic resonance signals produced by a magnetic resonance scanner from an examination subject has an operating circuit and a local coil assembly composed of at least two individual coils, wherein the operating circuit activates individually at least one of the at least two coils, and the operating circuit is located inside an RF-shielded room surrounding the magnetic resonance scanner.

Depending on the nature of the examination and the region under examination, an operator of the magnetic resonance apparatus, for instance a member of medical staff, typically arranges a local coil assembly on the surface of the region under examination. The better the local coil assembly encompasses the surface of the region to be examined, the higher the quality of the image data to be generated. Hence there are dedicated local coil assemblies for most types of regions respectively designed that are commonly examined, for instance coils such as a foot coil, a shoulder coil and flexible coils that can be placed around the abdomen of an examination subject, for example. A local coil assembly typically has a number of RF antennas, i.e. a number of coils, each designed to receive magnetic resonance signals within a defined region.

At the start of a magnetic resonance examination, i.e. of an examination using a magnetic resonance apparatus, a local coil assembly is usually positioned on the examination region and then the coils required for the magnetic resonance examination are activated. An activated coil means that during acquisition of raw data, the activated coil receives magnetic resonance signals that are used to generate the image data. Typically, the operating circuit can be used not only to activate but also to deactivate at least one of the at least two coils.

The activation of individual coils is particularly advantageous when a sub-region of the examination subject, this sub-region being enclosed by the local coil assembly, is larger than the examination region. Activating and thereby using a number of coils, which are arranged so as to receive magnetic resonance signals from the examination region during the magnetic resonance imaging, increases the signal-to-noise ratio. Conversely, activating and thereby using coils that are arranged such that they receive magnetic resonance signals from outside the examination region during the magnetic resonance imaging degrades the image data for reconstruction. Hence, activating the appropriate coils is advantageous in magnetic resonance imaging. As noted, activated coils are those coils that they receive magnetic resonance signals during a magnetic resonance examination.

In order to avoid impairing the functionality of the magnetic resonance scanner, the scanner is usually situated in a separate, RF-shielded room, which is enclosed by an RF shield that shields the generated fields from external interference and prevents propagation outside the RF-shielded room of the electromagnetic fields produced by the magnetic resonance scanner. It is conventional to use a control computer that is outside an RF-shielded room surrounding the magnetic resonance scanner in order to activate the individual coils. This means that, when preparing for a magnetic resonance examination, the operator of the magnetic resonance scanner, for instance a member of medical staff, positions the examination subject and the local coil assembly on the magnetic resonance scanner, and then leaves the RF-shielded room in order to use the control computer of the magnetic resonance scanner to activate individual coils. This is time-consuming and can require repositioning of the local coil assembly if, upon activating the individual coils, it is discovered that the local coil has been positioned unsuitably.

The signal receiver according to the invention is used to receive magnetic resonance signals and to control the reception of the magnetic resonance signals. Controlling the reception of the magnetic resonance signals can be performed in an automated manner and/or by the operating circuit, the operating circuit being operated by an operator. The operating circuit can be designed, for example, in the form of a switch, in particular a toggle switch, and/or a pushbutton. The operating circuit can preferably be operated intuitively by an operator.

By virtue of the operating circuit being situated inside an RF-shielded room surrounding the magnetic resonance scanner during positioning of the local coil assembly on the examination subject, the operating circuit can be used to activate at least one coil without an operator who is arranging the local coil assembly on the examination subject having to leave the RF-shielded room. Opening and/or closing a door of the RF-shielded room thus can be avoided, this door typically satisfies particular RF requirements and hence being difficult to move. This allows a simpler and/or smoother workflow for preparing for a magnetic resonance examination.

The local coil assembly arranged on the examination subject is preferably within view of the operator when this operator uses the operating circuit to activate at least one coil of the local coil assembly. Both the operating circuit and the local coil assembly are arranged inside the RF-shielded room. The activated coils hence can be checked visually inside the RF-shielded room, so it can be reliably assured that the coils are activated correctly for the particular examination. Hence, it can be effectively ensured that, during acquisition of the medical raw data, those coils of the local coil assembly are active that can receive magnetic resonance signals from inside the examination region and/or result in an optimum quality of the image data to be generated. The method according to the invention reduces the likelihood that a magnetic resonance examination must be repeated as a result of incorrectly selected coils. It likewise reduces the likelihood that the quality of the image data to be generated is lowered because of incorrectly selected coils. Arranging the local coil assembly and/or activating individual coils is simplified and can be performed particularly quickly in accordance with the method according to the invention. Overall, arranging the operating circuit inside the RF-shielded room makes it easier to select the coils relevant to the magnetic resonance examination.

In an embodiment of the signal receiver, the operating circuit is within reach of a person standing immediately beside the magnetic resonance scanner. A person standing immediately beside the magnetic resonance scanner can typically touch the magnetic resonance scanner. A person arranging a local coil assembly on the examination subject, the examination subject being situated on the patient support of the magnetic resonance scanner, is normally standing immediately beside the magnetic resonance scanner. The operating circuit is within reach of such a person if the person standing immediately beside the magnetic resonance scanner can touch the operating circuit and/or can operate the operating circuit so that this person can activate a coil using the operating circuit. Preferably, the person can touch the magnetic resonance scanner and the operating circuit simultaneously. The person is typically a technician who operates the scanner.

An advantage of this embodiment of the signal receiver is that a person can operate the operating circuit in the immediate vicinity of the examination subject without having to change his or her spatial position. It is thereby possible to arrange the local coil assembly and activate required coils, i.e. prepare for a magnetic resonance examination, particularly efficiently.

In an embodiment of the signal receiver, the operating circuit is situated at at least one of the following locations:
the operating circuit is on the local coil assembly;
the operating circuit is integrated in the local coil assembly;
the operating circuit is on the magnetic resonance scanner;
the operating circuit is an operable mobile display inside an RF-shielded room surrounding the magnetic resonance scanner;
the operating circuit is on a patient support and/or integrated in the patient support, on which the examination subject is positioned while the magnetic resonance signals are being received.

The operating circuit can be situated, for instance, on the surface of the local coil assembly, with the operating circuit being mounted on the exterior surface of the local coil assembly. The operating circuit can also be designed to be part of the local coil assembly, i.e. integrated therein. An example of such an integration of the operating circuit in the local coil assembly is a pushbutton and/or toggle switch, which, for instance, is integrated in the surface of the local coil assembly and connected to at least one coil of the local coil assembly such that this coil can be activated by the operating circuit. The operating circuit can have a separate subunit for each coil. Each such subunit can be a pushbutton and/or a toggle switch, for example, such a subunit is used to activate and/or deactivate the individual coil to which it is connected. An operating circuit designed in this way can be operated intuitively because the position of an individual subunit preferably implies the position of the corresponding coil. In this case, the operator can define and activate, at the examination subject and at the local coil assembly, the coils that are relevant to the examination region. Preparing for the examination thus can be performed intuitively and accurately. In addition, the operator can operate the operating circuit in the immediate vicinity of the examination subject without having to change his or her spatial position. It is thereby possible to arrange the local coil assembly and activate required coils, i.e. perform preparations for a magnetic resonance examination, particularly efficiently.

Alternatively or additionally, the operating circuit can be situated on the magnetic resonance scanner, in particular on the exterior surface of the magnetic resonance scanner. For this purpose, the operating circuit can be arranged on the housing of the magnetic resonance scanner, for instance at the side on the end face and/or above the patient placement zone. The operating circuit can also be arranged at the side of and/or above the patient support. The operating circuit can be used to activate coils of various local coil assemblies, so that the operating circuit is independent of the local coil assembly that is used. The operating circuit is preferably arranged at the same position of the magnetic resonance scanner regardless of the local coil assembly used, and regardless of the magnetic resonance examination, so that the operating circuit can be found particularly easily. In addition, the operator can operate the operating circuit in the immediate vicinity of the examination subject without having to change his or her spatial position. It is thereby possible to arrange the local coil assembly and activate required coils, i.e. perform preparations for a magnetic resonance examination, particularly efficiently.

The operating circuit can also be designed as a mobile display, for instance as a tablet computer, which can also be used inside the RF-shielded room. The mobile display is for this purpose made MR-compatible, but the mobile display can also be used outside the RF-shielded room. Using the mobile display inside the RF-shielded room allows flexible activation of the coils, because an operator can use the operating circuit from any position inside the RF-shielded room.

Alternatively or additionally, the operating circuit can be situated on the patient support or integrated therein. The examination subject is typically placed horizontally on the patient support, which means that the examination subject conceals much of the patient support from the view of an operator. A local coil assembly can be integrated in the patient support, for instance for spinal column examinations, which means that this local coil assembly is mostly concealed by the examination subject. The coils of such a local coil assembly can then be activated particularly well using an operating circuit arranged on, or integrated in, the patient support, particularly if the operating circuit is on the side of the patient support and/or is integrated in the side thereof. In this case, the operating circuit can then be operated by an operator even when an examination subject is positioned on the patient support. In addition, coils of local coil assemblies that are used for magnetic resonance examinations other than spinal column examinations can be activated using an operating circuit integrated in the patient support or arranged thereon.

In an embodiment of the signal receiver, the signal receiver has an indicator that shows the activity of at least one coil of the at least two coils and is inside the RF-shielded room surrounding the magnetic resonance scanner.

The indicator is designed to visualize the activity of a particular coil. The indicator shows whether that coil is active or inactive. This is advantageous because after activating a coil, an operator receives feedback via the indicator as to which coils actually are active. Hence forgetting or overlooking a deactivation of a coil that may have been automatically activated can be avoided. The selection of the coils can be checked visually inside the RF-shielded room, so that an activity state of each coil, i.e. an active state or an inactive state, can still be corrected during preparations for the magnetic resonance examination. It is hence possible to prevent starting and/or performing a magnetic resonance examination uses an incorrectly activated coil. The operator leaving the RF-shielded room while there is an incorrectly activated coil thus can be prevented. This allows the operator workflow to be organized more smoothly.

In an embodiment of the signal receiver, the indicator is situated according to at least one of the following locations:
- the indicator is on the local coil assembly;
- the indicator is integrated in the local coil assembly;
- the indicator is an operable mobile display inside an RF-shielded room surrounding the magnetic resonance scanner;
- the indicator is on a patient support and/or integrated in the patient support, on which the examination subject is positioned while the magnetic resonance signals are being received;
- the indicator is situated such that the activity of the associated coil is displayed as a projection onto that coil.

The indicator can be situated, for instance, on the exterior surface of the local coil assembly, with the indicator being mounted on the surface of the local coil assembly. The indicator can also be designed to be part of the local coil assembly, i.e. integrated therein. An example of such an integration of the indicator in the local coil assembly is at least one lamp, which, for instance, is integrated in the surface of the local coil assembly and connected to at least one coil of the local coil assembly such that the activity of this coil is visualized by the lamp. The lamp can be illuminated, for example, when the coil is in the active state. The indicator can have a separate subunit for each coil, which subunit may be a lamp, for example, wherein the subunit can be used to visualize the activity of that coil.

An indicator arranged in this way can be understood intuitively because the position of the individual subunit implies the position of the corresponding coil. In this case, the operator can define at the examination subject at the local coil assembly with particular accuracy the coils relevant to the region under examination, activate those coils using the operating circuit and/or check their activation using the indicator. Preparing for the examination thus can be performed particularly intuitively and accurately. In addition, the operator can evaluate a result from the indicator in the immediate vicinity of the examination subject without having to change his or her spatial position. It is thereby possible to arrange the local coil assembly, activate required coils, and check that the coils are activated correctly, i.e. perform preparations for a magnetic resonance examination, particularly efficiently.

The indicator can also be designed as a mobile display, for instance as a tablet computer, which can also be used inside the RF-shielded room. The mobile display is made MR-compatible for this purpose. The coils of the local coil assembly and the activity state of these coils are preferably visualized on the mobile display. The visualization is preferably a spatial visualization and preferably also includes spatial information about the examination subject and/or the required region under examination. The mobile display can also be used outside the RF-shielded room. Using the mobile display inside the RF-shielded room allows flexible checking of the activated coils, because an operator can use the indicator from any position inside the RF-shielded room. When the indicator is designed as a mobile display, the operating circuit is preferably also embodied as a mobile display so that the operator can thereby exercise complete control of the coils.

Alternatively or additionally, the indicator can be situated on a patient support and/or integrated therein. The local coil assembly can be integrated in the patient support, for instance for spinal column examinations, which means that most of this local coil assembly is concealed by the examination subject. The activity of a coil of such a local coil assembly can then be visualized particularly well using an indicator on, or integrated in, the patient support, particularly if the indicator is on the side of the patient support and/or is integrated in the side thereof. In this case, the indicator can then be seen by an operator even when an examination subject is positioned on the patient support. In addition, the activity of coils of local coil assemblies that are used for magnetic resonance examinations other than spinal column examinations can be checked using an indicator integrated in the patient support or arranged thereon.

In addition, the indicator can be arranged so as to show an activity of a coil as a projection. For instance, a light source can be used to highlight, in particular illuminate, a first portion of a surface of the local coil assembly, which first portion defines a position and/or spatial extent of a coil. An advantage of this embodiment is that the indicator can be installed in the RF-shielded room independently of the local coil assembly being used.

In an embodiment of the signal receiver, a signal emitted by the indicator for the purpose of showing the activity is visible during positioning of the examination subject. The positioning of the examination subject usually includes supporting the examination subject on a patient support, arranging a local coil assembly on the examination subject as close as possible to the region under examination, and defining and activating coils to be used in the magnetic resonance examination. Then the patient support together with the examination subject is moved into the isocenter of the magnetic resonance scanner.

According to this embodiment, the indicator is arranged such that activity of a coil is discernible when the local coil assembly is arranged on the examination subject on the patient support, and the examination subject together with the patient support is located mainly outside the magnetic resonance scanner, in particular the examination region lies mainly outside the magnetic resonance scanner. A person located immediately beside the magnetic resonance scanner can detect visually, so for instance see by eye, during the time period after arranging the local coil assembly on the examination subject, a signal emitted by the indicator. This embodiment of the signal receiver according to the invention allows an activity state of a coil to be checked intuitively. Once the examination subject has been positioned, in particular after the patient support together with the examination subject has been moved into the isocenter of the magnetic resonance scanner, a signal emitted by the indicator may go off.

In another embodiment of the signal receiver, a signal emitted by the indicator for showing the activity can be seen by a person standing immediately beside the magnetic resonance scanner. An advantage of this embodiment of the signal receiver according to the invention is allowing an activity state of a coil to be checked intuitively.

In another embodiment of the signal receiver, a signal emitted by the indicator for the purpose of showing the activity of a coil of the at least two coils shows a position and/or extent of the coil and/or an extent of a sensitivity range of the coil. The indicator can be designed, for example, to emit a light signal when the coil is in an active state, which light signal defines a projection of the spatial profile of the coil. An advantage of this embodiment is that the operator can make a particularly good comparison of the required examination region with the activated coils. If required, the operator can activate and/or deactivate a coil, so that the activated coils optimally encompass the region under examination. The same applies to the case in which a signal emitted by the indicator shows the position of a coil.

Alternatively or additionally, the light signal can define at least one projection of the sensitivity range of the coil. The sensitivity range of a coil is such that the coil can receive magnetic resonance signals produced within that sensitivity range. An advantage of this embodiment is that the operator can make a particularly good comparison of the required examination region with the sensitivity range of the activated coil. If required, the operator can activate and/or deactivate a coil, so that the sensitivity ranges corresponding to the activated coils optimally encompass the region under examination.

The invention also encompasses a method for preparing for a magnetic resonance examination of an examination subject using a signal receiver according to the invention, which includes a local coil assembly and an operating circuit as described above, with the following method steps.

As a first step, the local coil assembly of the receiver is placed on an examination subject, and the operating circuit is used to activate at least one coil of the local coil assembly of the receiver. The examination subject, together with the local coil assembly with the activated coil thereof, is positioned in a magnetic resonance data acquisition scanner.

These method steps are usually performed by an operator of the magnetic resonance scanner. The first two method steps, i.e. arranging the receiver on the examination subject and activating at least one coil, are preferably performed inside the RF-shielded room. Positioning the examination subject in the magnetic resonance scanner, in particular in its isocenter, is normally performed in an automated manner initiated by the operator. The operator can perform the initiation either from inside and outside the RF-shielded room.

Once the examination subject together with the activated coil have been positioned in the magnetic resonance scanner, the magnetic resonance examination can be started. The beginning of the magnetic resonance examination is usually performed with interaction of the operator with a control computer of the magnetic resonance apparatus, with the operator usually having already exited and closed the RF-shielded room by this point in time. During the magnetic resonance examination, the operator is typically located outside the RF-shielded room.

The invention also encompasses a method for preparing for a magnetic resonance examination of an examination subject using a signal receiver, which has a local coil assembly and an operating circuit as described above, with the following method steps.

As a first step, the local coil assembly of the receiver is placed on the examination subject, and the operating circuit is used to activate at least one coil of the local coil assembly of the receiver. The activation of at least one coil causes a signal to be emitted by the indicator associated with that at least one coil, and a visual check is made as to the position of the activated coil, based on the emitted signal. The examination subject is then positioned, together with the local coil assembly having the activated coil, in a magnetic resonance data acquisition scanner.

In an embodiment of the method according to the invention described above, the receiver has an indicator as described above, and the indicator of the signal receiver is used to perform, while still in the RF-shielded room, a visual check of activity of a coil. The two method steps of activating at least one coil and visually checking an activated coil are preferably performed iteratively until a combination of the coils of the local coil assembly is active that is ideally matched to the region under examination.

The advantages of the embodiments of the method according to the invention essentially correspond to the advantages of the signal receiver according to the invention for receiving magnetic resonance signals produced by a magnetic resonance scanner from an examination subject, as explained in detail above. Features, advantages and alternative embodiments mentioned above are also applicable to the embodiments of the method.

DESCRIPTION OF THE PREFERRED EMBODIMENTS

Figure 1:
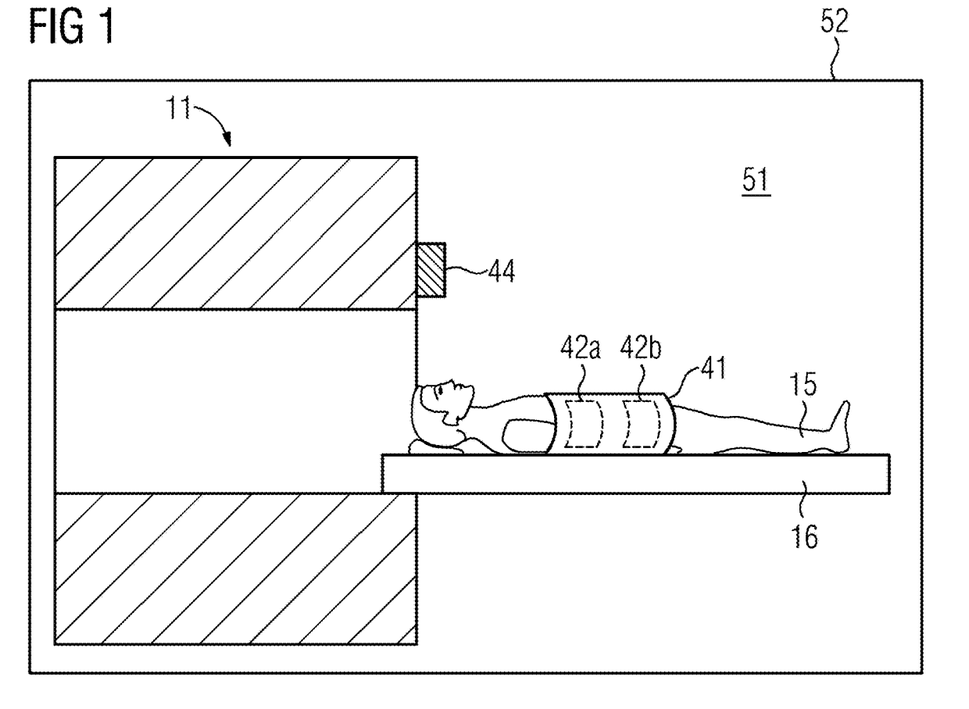
FIG. 1 schematically illustrates a first embodiment of a signal receiver according to the invention.

FIG. 1 schematically illustrates a first embodiment of a signal receiver according to the invention. The signal receiver is designed to receive magnetic resonance signals produced by a magnetic resonance scanner 11 from an examination subject, in particular from a patient 15. The patient 15 can be moved by a patient support 16 of the magnetic resonance scanner 11. The patient support 16 for this purpose has a patient bed, which is movable within the magnetic resonance scanner 11. The magnetic resonance scanner 11 is inside a room 51 that is RF-shielded by an RF shield 52.

The signal receiver has an operating circuit 44 and a local coil assembly 41, the local coil assembly 41 having at least two coils 42a, 42b. The local coil assembly 41 is typically arranged on the patient 15 such that the local coil assembly 41 encompasses the region under examination.

The operating circuit 44 is used to individually activate at least one coil of the at least two coils 42a, 42b. Each coil of the at least two coils 42a, 42b of the local coil assembly 41, can be activated individually. In this embodiment, the operating circuit 44 is arranged on the magnetic resonance scanner 11 and inside the RF-shielded room 51. Moreover, the operating circuit 44 is situated such that it can be operated by a person standing immediately beside the magnetic resonance scanner 11. Hence the signal receiver 44 is arranged within reach of a person standing immediately beside the magnetic resonance scanner 11. The person standing immediately beside the magnetic resonance scanner 11 preferably can touch the operating circuit 44 and the local coil assembly 41 simultaneously. The field of view of the person standing immediately beside the magnetic resonance scanner 11 preferably includes the operating circuit 44 and the local coil assembly 41, particularly when positioning the patient 15, which is typically performed while most of the patient bed of the patient support 16 is outside the magnetic resonance scanner 11.

Figure 2:
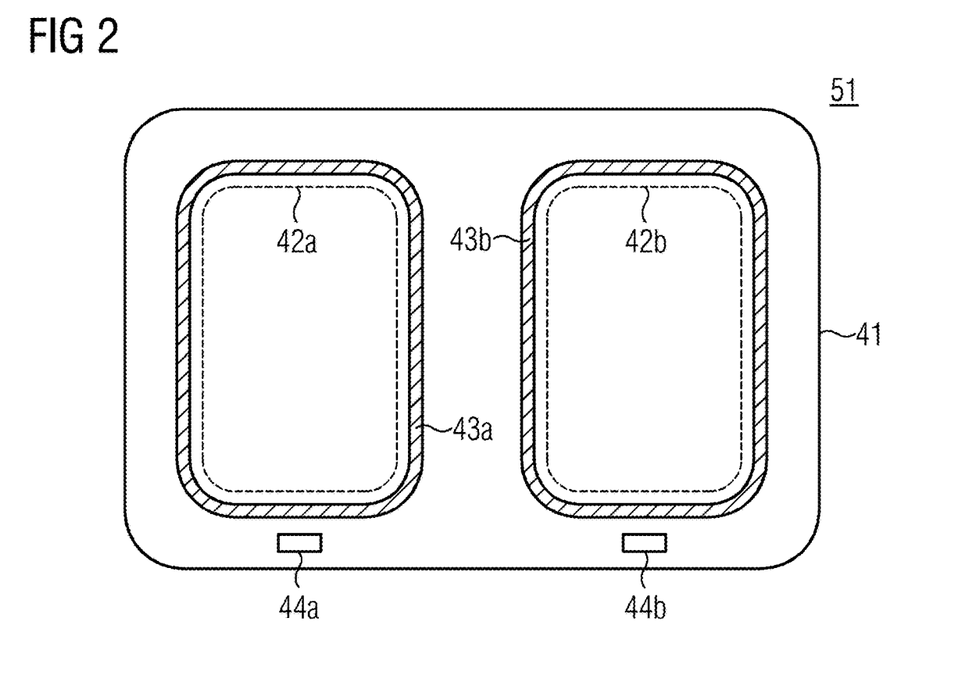
FIG. 2 schematically illustrates a second embodiment of a signal receiver according to the invention.

FIG. 2 schematically shows a second embodiment of the signal receiver according to the invention. Again this signal receiver is arranged inside the RF-shielded room 51. In this embodiment, the operating circuit 44a, 44b of the signal receiver is arranged on the local coil assembly 41 and/or integrated in the local coil assembly 41. The operating circuit 44a, 44b can be in the form of two toggle switches, for example. In addition, the signal receiver has indicator 43a, 43b, which can be used to show activity of at least one coil of the at least two coils 42a, 42b. The indicators 43a, 43b are inside the RF-shielded room 51 surrounding the magnetic resonance scanner 11. The indicators 43a, 43b are arranged on the local coil assembly 41 and/or integrated in the local coil assembly 41. The indicators 43a, 43b are designed to display a signal that shows the activity of a respective coil of the at least two coils 42a, 42b during positioning of the examination subject, in particular the patient 15, such that this emitted signal is visible to a person located immediately beside the magnetic resonance scanner 11.

The indicators 43a, 43b shown here are designed such that, when showing an activity of a coil of the at least two coils 42a, 42b, it visualizes the spatial extent of that coil. This is achieved in this case by the indicators 43a, 43b approximately reproducing on the surface of the local coil assembly 41, the profile of the coils 42a, 42b that are under that surface, for instance by illuminating the profile on the surface of the local coil assembly 41. A position of a coil 42a, 42b and/or a spatial extent of a sensitivity range of a coil 42a, 42b can also be shown in a similar way.

Figure 3:
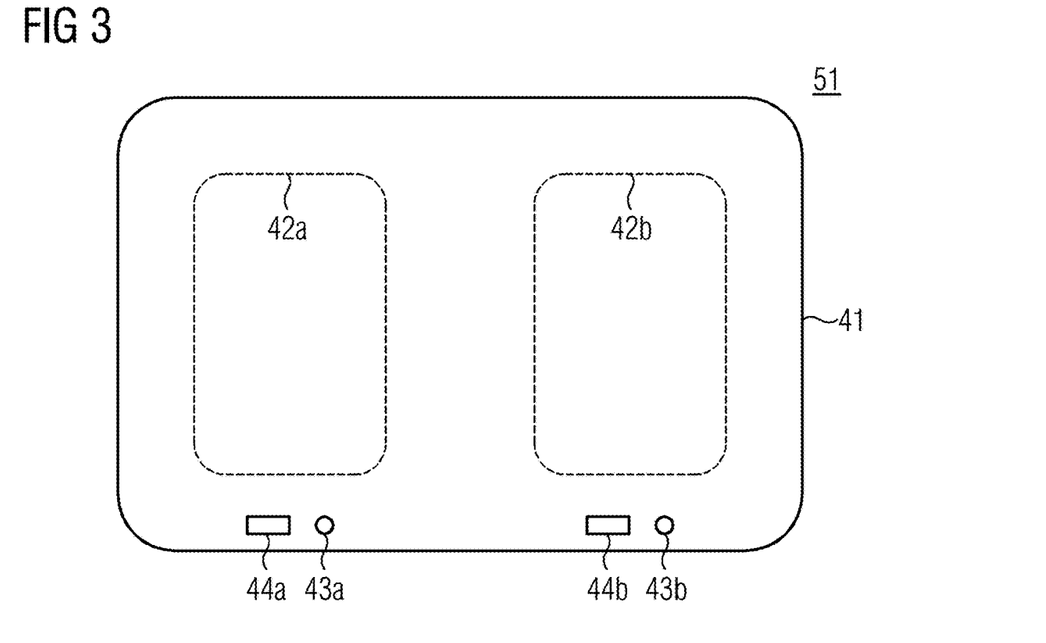
FIG. 3 schematically illustrates a third embodiment of a signal receiver according to the invention.

FIG. 3 schematically shows a third embodiment of the signal receiver according to the invention. Like the second embodiment shown in FIG. 2, the signal receiver has operating circuit 44a, 44b and indicator 43a, 43b, with both the indicators 43a, 43b and the operating circuit 44a, 44b being arranged on the local coil assembly 41 and/or integrated in the local coil assembly 41. The operating circuit 44a, 44b can be in the form of two toggle switches, for example. A first part of the indicator 43a visualizes an activity of the coil 42a, and a second part of the indicator 43b visualizes an activity of the coil 42b. The first part of the indicator 43a can be a lamp for this purpose, which lamp has a position that is associated spatially with a position of the coil 42a. The second part of the indicator 43b can also be a lamp at a position that is associated spatially with a position of the coil 42b. The lamps can light, for example, when the corresponding coil is in the active state.

Figure 4:
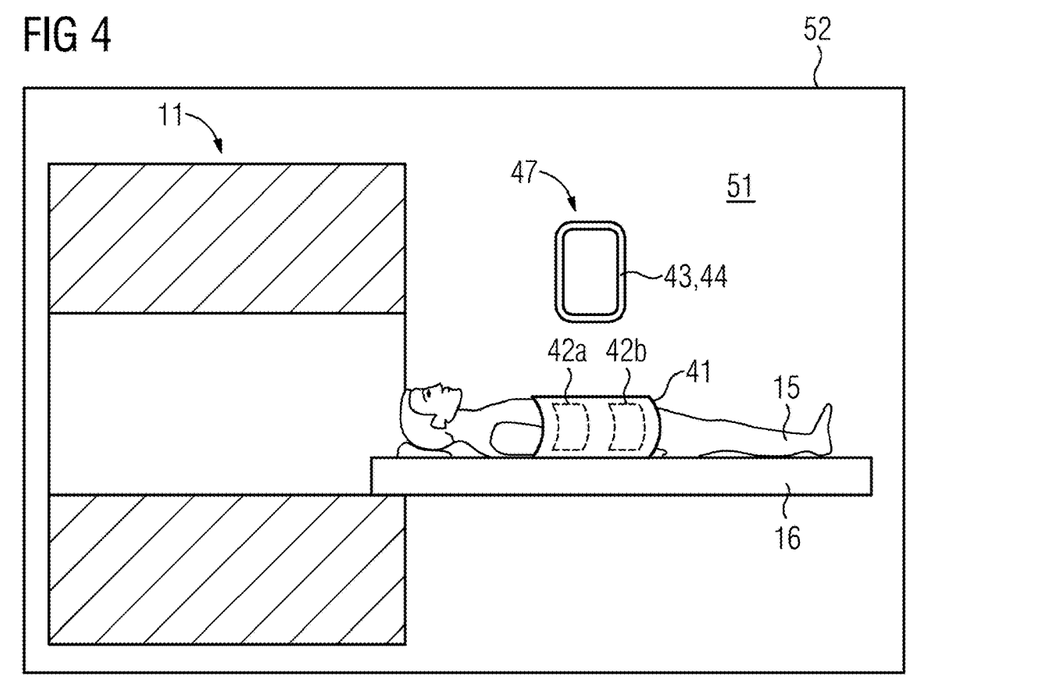
FIG. 4 schematically illustrates a fourth embodiment of a signal receiver according to the invention.

FIG. 4 schematically shows a fourth embodiment of the signal receiver according to the invention. Again this signal receiver has an operating circuit 44 and an indicator 43, the operating circuit 44 and/or the indicator 43 being designed as an operable mobile display 47. The operable mobile display 47 can be situated and used inside the RF-shielded room 51. The operable mobile display 47 may be a tablet computer, for instance.

Figure 5:
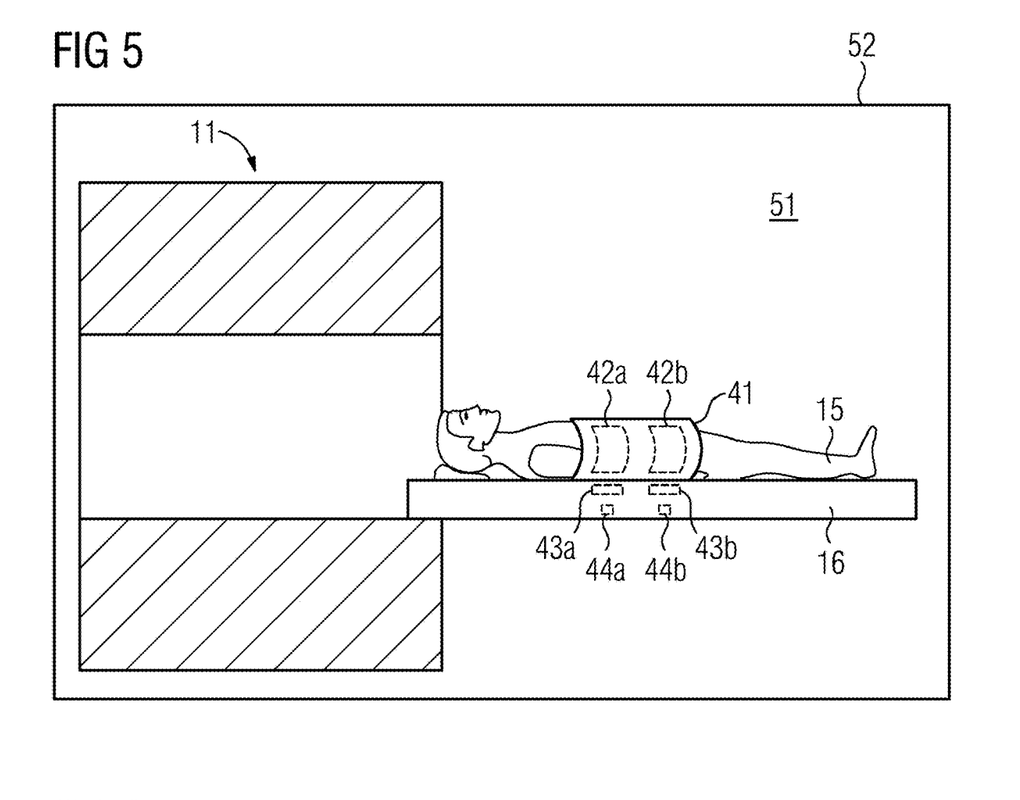
FIG. 5 schematically illustrates a fifth embodiment of a signal receiver according to the invention.

FIG. 5 schematically shows a fifth embodiment of the signal receiver according to the invention. According to this embodiment, the operating circuit 44a, 44b is arranged on the patient support 16 and/or integrated in the patient support 16. During preparation for the magnetic resonance examination, the examination subject, in particular the patient 15, is typically positioned on a patient bed of the patient support 16. While the magnetic resonance examination is being performed, the patient bed is then moved inside the magnetic resonance scanner 11. Like the operating circuit 44a, 44b, indicators 43a, 43b can also be arranged on the patient support 16 and/or integrated in the patient support 16. Alternatively, the indicators 43, 43a, 43b can also be designed such that an activity of at least one coil 42a, 42b is displayed as a projection onto the coil 42a, 42b.

Figure 6:
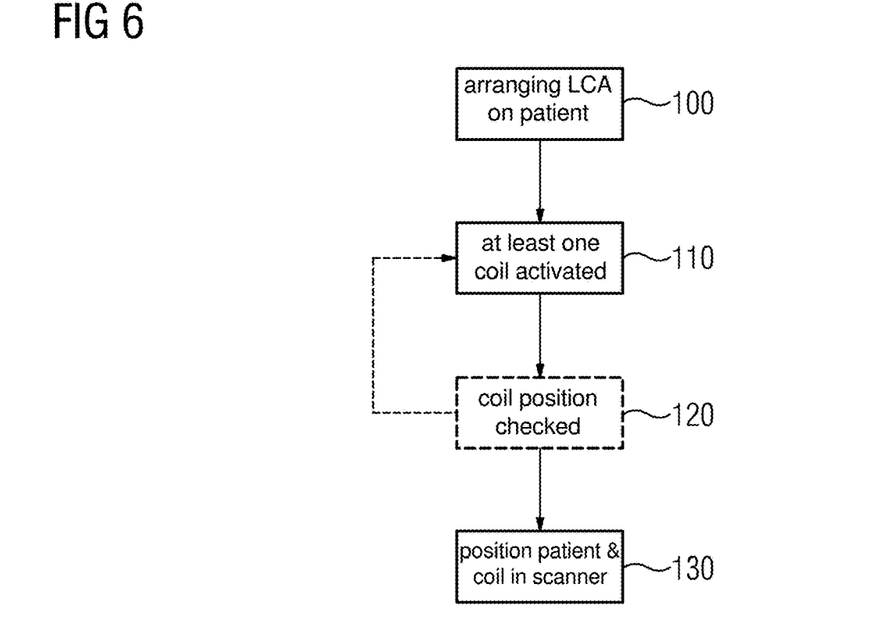
FIG. 6 is a flowchart of an embodiment of the method according to the invention.

FIG. 6 is a flowchart of an embodiment of the method according to the invention for preparing for an examination of an examination subject, in particular of a patient 15, using a magnetic resonance scanner 11 and a signal receiver. At the start of the method, the examination subject, in particular the patient 15, is typically located outside the magnetic resonance scanner 11. The patient 15 is already positioned on the patient support 16. The method according to the invention starts with method step 100, arranging the local coil assembly 41 on the patient 15. In method step 110, the operating circuit 44, 44a, 44b is used to activate at least one coil 42a, 42b of the signal receiver, taking into account the examination region of the patient 15. If the signal receiver 41 has an indicator 43, 43a, 43b, then optionally method step 120 can be performed: according to method step 120, a position of the at least one activated coil 42a, 42b is checked visually on the basis of a signal emitted by the indicator 43, 43a, 43b. This is followed by method step 130, positioning the patient 15 together with the activated coil 42a, 42b in the magnetic resonance scanner 11. After the end of the method according to the invention, the magnetic resonance examination, in particular the acquisition of magnetic resonance signals, can begin.

The method steps 100, 110, 120 and 130 are typically performed by an operator of the magnetic resonance scanner 11. Thus, if the operator performs the optional method step 120, a position of an activated coil 42a, 42b is visually checked, then after method step 120 the operator can initiate method step 130 if the operator approves the activated coil 42a, 42b. If the operator does not accept the activated coil 42a, 42b, then method step 110 can be repeated if required, using the operating circuit 44, 44a, 44b to activate a coil 42a, 42b comprised by the signal receiver. In general, the method steps 110 and 120 can be performed iteratively.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A receiver for receiving magnetic resonance (MR) signals produced by an MR data acquisition scanner from an examination subject, said MR data acquisition scanner being situated inside of a radio-frequency-shielded (RF-shielded) room, said receiver comprising:
    an operating circuit situated inside said RF-shielded room and within reach of a person standing immediately beside said MR data acquisition scanner, the operating circuit being manually operable; and
    a local coil assembly comprising at least two individually activatable coils, each configured to receive said MR signals, wherein said operating circuit is in communication with said at least two coils and is configured to individually activate at least one of said at least two coils.

2. A receiver as claimed in claim 1 wherein said examination subject is positioned on a patient support that is movable with respect to said MR data acquisition scanner, and wherein said operating circuit is situated at a location selected from the group consisting of, on said local assembly, integrated in said local coil assembly, on said MR data acquisition scanner, in a mobile display situated inside said RF-shielded room, on said patient support, and integrated in said patient support.

3. A receiver as claimed in claim 1 comprising an indicator that indicates activity individually of any of said at least two coils that are activated, said indicator being situated inside said RF-shielded room.

4. A receiver as claimed in claim 3 wherein said examination subject is positioned on a patient support that is movable with respect to said MR data acquisition scanner, and wherein said indicator is situated at a location selected from the group consisting of, on said local assembly, integrated in said local coil assembly, on said MR data acquisition scanner, in a mobile display situated inside said RF-shielded room, on said patient support, and integrated in said patient support.

5. A receiver as claimed in claim 3 wherein said indicator emits a signal that is visible during positioning of the examination subject relative to the MR data acquisition scanner.

6. A receiver as claimed in claim 3 wherein said indicator emits a signal indicating said activity, said signal being perceptible by said person standing immediately next to said MR data acquisition scanner.

7. A receiver as claimed in claim 3 wherein said indicator emits a signal that indicates said activity of a respective coil of said local coil assembly, and also indicates at least one of a position of the activated coil, an extent of the activated coil, and an extent of a sensitivity range of the activated coil.

8. A method for preparing a magnetic resonance (MR) examination of an examination subject to be conducted by an MR data acquisition scanner situated inside of a radio-frequency-shielded (RF-shielded) room, using a receiver comprising a local coil assembly comprising at least two coils, and said receiver comprising an operating circuit that individually activates at least one of said at least two coils, said method comprising:
    arranging the local coil assembly on the examination subject;
    with said operating circuit, activating at least one coil of said local coil assembly, wherein said operating circuit is situated inside said RF-shielded room and within reach of a person standing immediately beside said MR data acquisition scanner, the operating circuit being manually operable; and
    positioning the examination subject together with the local coil assembly with the activated coil in the MR data acquisition scanner, wherein said receiver remains at all times inside said RF-shielded room in which said MR data acquisition scanner is situated.

9. A receiver for receiving magnetic resonance (MR) signals produced by an MR data acquisition scanner from an examination subject, said MR data acquisition scanner being situated inside of a radio-frequency-shielded (RF-shielded) room, said receiver comprising:
    an operating circuit situated inside said RF-shielded room;
    a local coil assembly comprising at least two individually activatable coils, each designed to receive said MR signals; and
    an indicator situated inside said RF-shielded room and configured to individually indicate activity of any of said at least two coils that are activated, wherein:
        operating circuit is in communication with said at least two coils and is operable to individually activate at least one of said at least two coils; and
        said indicator emits a signal that indicates said activity of a respective coil of said local coil assembly, and that indicates at least one of: a position of the activated coil, an extent of the activated coil, and an extent of a sensitivity range of the activated coil.

10. A receiver as claimed in claim 9 wherein said operating circuit is manually operable and is situated within reach of a person standing immediately beside said MR data acquisition scanner.

11. A receiver as claimed in claim 9 wherein said examination subject is positioned on a patient support that is movable with respect to said MR data acquisition scanner, and wherein said operating circuit is situated at a location selected from the group consisting of, on said local assembly, integrated in said local coil assembly, on said MR data acquisition scanner, in a mobile display situated inside said RF-shielded room, on said patient support, and integrated in said patient support.

12. A receiver as claimed in claim 9 wherein said examination subject is positioned on a patient support that is movable with respect to said MR data acquisition scanner, and wherein said indicator is situated at a location selected from the group consisting of, on said local assembly, integrated in said local coil assembly, on said MR data acquisition scanner, in a mobile display situated inside said RF-shielded room, on said patient support, and integrated in said patient support.

13. A receiver as claimed in claim 9 wherein said signal is visible during positioning of the examination subject relative to the MR data acquisition scanner.

14. A receiver as claimed in claim 9 wherein said signal is perceptible by a person standing immediately next to said MR data acquisition scanner.

* * * * *